(12) United States Patent
Coppa et al.

(10) Patent No.: US 10,304,668 B2
(45) Date of Patent: May 28, 2019

(54) LOCALIZED PROCESS CONTROL USING A PLASMA SYSTEM

(71) Applicant: Tokyo Electron Limited, Minato-ku, Tokyo (JP)

(72) Inventors: Brian J. Coppa, Eagle, ID (US); Vaidya Bharadwaj, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 26 days.

(21) Appl. No.: 15/592,895

(22) Filed: May 11, 2017

(65) Prior Publication Data

US 2017/0345626 A1 Nov. 30, 2017

Related U.S. Application Data

(60) Provisional application No. 62/340,888, filed on May 24, 2016.

(51) Int. Cl.

| | |
|---|---|
| *H01J 37/22* | (2006.01) |
| *C23C 16/44* | (2006.01) |
| *C23C 16/455* | (2006.01) |
| *H01J 37/32* | (2006.01) |

(52) U.S. Cl.
CPC .... *H01J 37/32963* (2013.01); *C23C 16/4401* (2013.01); *C23C 16/455* (2013.01); *C23C 16/45563* (2013.01); *H01J 37/3299* (2013.01); *H01J 37/32449* (2013.01)

(58) Field of Classification Search
None
See application file for complete search history.

(56) References Cited

U.S. PATENT DOCUMENTS

| | | | |
|---|---|---|---|
| 5,356,478 A | 10/1994 | Chen et al. | |
| 5,846,883 A * | 12/1998 | Moslehi | H01J 37/321 438/711 |
| 5,849,639 A | 12/1998 | Molloy et al. | |

(Continued)

OTHER PUBLICATIONS

Mohamed, et al. "A Dry Process for Polymer Sidewall Residue Removal After Via-Hole Etching" 2000 IEEWSEMI Advanced Semiconductor Manufacturing Conference, pp. 281-286 (6 pages).

(Continued)

*Primary Examiner* — Allan W. Olsen
(74) *Attorney, Agent, or Firm* — Rothwell, Figg, Ernst & Manbeck, P.C.

(57) ABSTRACT

Plasma processing conditions may be changed for localized regions of a substrate. A reactive gas may be maintained in a localized region of a substrate while other regions of the substrate are not exposed to the reactive gas. Thus, plasma conditions may be generated at specific regions of the substrate. A multi-zoned gas injection system may be utilized to direct certain gases in certain regions of the plasma space. Techniques may be provided to maintain these gases in the desired regions, as opposed to the gases spreading across the substrate surface. Reactive gases may be provided in one region while a flow of inert gas is provided in other regions in which it is desired to restrict the effects of the reactive gases. Localized control of the plasma process may be provided as a separate plasma processing step. The localized region of the substrate may be the substrate edge.

43 Claims, 6 Drawing Sheets

(56) References Cited

U.S. PATENT DOCUMENTS

| | | | |
|---|---|---|---|
| 5,904,570 A | 5/1999 | Chen et al. | |
| 5,976,261 A * | 11/1999 | Moslehi | C23C 16/45574 118/719 |
| 6,046,115 A | 4/2000 | Molloy et al. | |
| 6,184,134 B1 | 2/2001 | Chaudhary et al. | |
| 6,203,620 B1 * | 3/2001 | Moslehi | H01J 37/321 118/723 R |
| 6,431,182 B1 | 8/2002 | Rakhshandehroo et al. | |
| 6,834,656 B2 | 12/2004 | Qingyuan et al. | |
| 6,955,177 B1 | 10/2005 | Chiu et al. | |
| 7,276,447 B1 | 10/2007 | Delgadino et al. | |
| 7,479,457 B2 | 1/2009 | Paduraru et al. | |
| 7,662,723 B2 * | 2/2010 | Hwang | H01J 7/3244 156/345.34 |
| 7,807,579 B2 | 10/2010 | Yang et al. | |
| 2003/0070620 A1 * | 4/2003 | Cooperberg | C23C 16/45574 118/723 AN |
| 2005/0173569 A1 * | 8/2005 | Noorbakhsh | C23C 16/45565 239/690 |
| 2007/0175861 A1 * | 8/2007 | Hwang | H01J 7/3244 216/67 |
| 2007/0293043 A1 * | 12/2007 | Singh | H01J 37/321 438/689 |
| 2008/0011424 A1 * | 1/2008 | Yin | H01J 7/32091 156/345.48 |
| 2008/0135517 A1 * | 6/2008 | Balasubramaniam | G03F 7/427 216/67 |
| 2011/0011338 A1 * | 1/2011 | Chuc | C23C 16/452 118/715 |
| 2012/0122302 A1 * | 5/2012 | Weidman | C23C 16/325 438/478 |
| 2013/0306758 A1 * | 11/2013 | Park | C23C 16/345 239/418 |
| 2015/0162169 A1 * | 6/2015 | Chen | H01J 7/32449 216/67 |
| 2015/0235811 A1 * | 8/2015 | Cooperberg | H01J 7/32449 438/719 |
| 2015/0371831 A1 * | 12/2015 | Rozenzon | H01J 37/3244 239/548 |
| 2016/0111258 A1 * | 4/2016 | Taskar | H01J 7/32449 156/345.24 |
| 2016/0268107 A1 * | 9/2016 | White | H01J 37/32899 |
| 2017/0338119 A1 * | 11/2017 | Zhang | H01L 21/3065 |
| 2018/0053629 A1 * | 2/2018 | Zhang | H01J 7/32082 |

OTHER PUBLICATIONS

M. A. Blauw et al., "Advanced time-multiplexed plasma etching of high aspect ratio silicon structures" Journal of Vacuum Science & Technology B 20, 3106 (2002) B 2 (6), Nov./Dec. 2002 American Vacuum Society pp. 3106-3110 (5 pages).

Reza Abdolvand et al., "An advanced reactive ion etching process for very high aspect-ratio sub-micron wide trenches in silicon" ELSEVIER Sensors and Actuators A 144 (2008) 109-116 (8 pages).

Stephen J. Fonash, "An Overview of Dry Etching Damage and Contamination Effects" J. Electrochem. Soc., vol. 137, No. 12, Dec. 1990 The Electrochemical Society, Inc. pp. 3885-3892 (8 pages).

J. W. McNabb et al., "Anisotropic reactive ion etching of InP in methane/hydrogen based plasmas" Journal of Vacuum Science & Technology B 9, 3535 (1991), Nov./Dec. 1991 American Vacuum Society pp. 3535-3537 (3 pages).

Hyung-Ho Park et al., "Characterization and removal of silicon surface residue resulting from CHF3/C2F6 reactive on etching" Journal of Applied Physics 76, 4596 (1994) American Institute of Physics pp. 4596-4602 (7 pages).

J. Bhardwaj et al., "Dry Silicon Etching for MEMs" The Symposium on Microstructures and Microfabricated Systems at the Annual Meeting of the Electrochemical Society, Montreal, Quebec, Canada. May 4-9, 1997 (13 pages).

Jeff E. Schramm et al., "Fabrication of high-aspect-ratio InP-based vertical-cavity laser mirrors using CH4/H2/O2/Ar, reactive ion etching" Journal of Vacuum Science & Technology B 15, 2031 (1997) Nov./Dec. 1997 American Vacuum Societ pp. 2031-2036 (6 pages).

Hyungtak Seo et al., "Low temperature remote plasma cleaning of the fluorocarbon and polymerized residues formed during contact hole dry etching" Journal of Vacuum Science & Technology B 20, 1548 (2002) Jul./Aug. 2002 American Vacuum Society pp. 1548-1555 (8 pages).

Percy B. Chinoy, "Reactive Ion Etching of Benzocyclobutene Polymer Films" IEEE Transactions on Components, Packaging, and Manufacturing Technology—Part C, Vol. 20, No. 3, Jul. 1997 pp. 199-206 (8 pages).

Jongkook Song et all, "Removal of the Metallorganic Polymer Residues Formed at Via Holes" Journal of The Electrochemical Society, 151 (5), Jan. 2004 pp. G323-G 327 (5 pages).

Jongkook Song et al., "Removal of the Polymer Formed at Via Hole with Via Etching Stopped on an Al layer Structure" Jpn. J. Appl. Phys. vol. 42 (2003) pp. 1216-1221 Part 1, No. 3, Mar. 2003 The Japan Society of Applied Physics (6 pages).

Ying Wang et al., "Understanding of Via-Etch-Induced Polymer Formation and Its Removal" J. Electrochem. Soc., vol. 144, No. 4, Apr. 1997 The Electrochemical Society, Inc. pp. 1522-1528 (7 pages).

* cited by examiner

LOCALIZED PROCESS CONTROL USING A PLASMA SYSTEM

This application claims priority to Provisional Patent Application No. 62/340,888, filed May 24, 2016; the disclosure of which is expressly incorporated herein, in its entirety, by reference.

BACKGROUND

The present disclosure relates to the processing of substrates in plasma process equipment. In particular, it provides a method to provide localized process control in a plasma processing system.

The use of plasma systems for the processing of substrates has long been known. For example, plasma processing of semiconductor wafers is well known. The plasma systems may be typically utilized for plasma etching and/or plasma deposition. Plasma processing presents numerous technical challenges. One such challenge is center to edge uniformity of the process across the substrate as the results of the plasma processing may vary across localized regions of the substrate. Common location specific varying results include deposition rates, deposition products, etch rates, etch selectivity, etch anisotropy, etc. which may vary across localized regions of the substrate. Thus, for example, etch rates, selectivity and anisotropy may vary from the center to the middle to the edge of a substrate. Similarly, deposition rates may vary from the center to the middle to the edge of a substrate. Thus, a variety of non-uniformities may result across differing areas of the substrate.

Often, the most variation in a process may be experienced at the edge of a substrate. For example, a circular substrate having a radius of 150 mm (for example "300 mm wafers") may exhibit the most variation at the edge of a substrate. In such an example, the edge may be considered as the portions of the substrate from approximately 130 mm to 150 mm, in one embodiment, and more particularly 140 mm to 150 mm in another embodiment. In one exemplary embodiment, for 300 mm substrates, the regions of the substrate may typically be considered in context of a center region 0-120 mm radius, a middle region 120-140 mm radius, and a center region 140-150 mm. As will be recognized, as the size of the substrate increases what is considered the corresponding "edge" region may scale accordingly.

As mentioned, the localized variations which occur in plasma processing may impact the results of the plasma processing. In semiconductor substrate processing, one effect of this is a variation in critical dimension (CD) control across the substrate. As CDs becomes increasingly smaller with each generation of processing techniques, the product tolerance for CD control variations across the semiconductor substrate become tighter and the impact of localized changes on CD control becomes more important. It has been found that process changes at the edges of semiconductor substrates have been challenging particularly with respect to CD control. Thus, for example, etching control of the linewidths created on a substrate may show the most variation at the edge of a substrate. Some of such variations have been attributed to localized changes in sidewall polymerization buildup and/or sidewall polymerization removal on structures of the substrate during etching, for example changes at the edge of the substrate as compared to the center and/or middle of the substrate.

A variety of techniques to address non-uniform CD control on a semiconductor substrate have been utilized. For example, the gases introduced into the plasma process may be adjusted. In one example, $O_2$ concentrations may be adjusted to affect the amount of polymer removal. In other examples, changes in concentrations of gases that encourage polymer buildup may be made. Further, pressure, power, temperature, electrode voltage, magnetic field, etc. changes may also be made to minimize non-uniformities across the substrate. Such techniques are generally applied across the entirety of the substrate. It has been found that there is a need for a method to provide improved process control over localized regions of a substrate during plasma processing.

SUMMARY

Described herein are innovative plasma processing methods that utilize localized plasma control. In such techniques, the plasma conditions may be purposefully changed for various localized regions of a substrate. Thus, for example, a reactive gas may be maintained in a localized region of a substrate while other regions of the substrate are not exposed to such reactive gas. In this manner, specific plasma conditions may be generated at specific regions of the substrate. The creation of a locally controlled plasma may occur through a variety of plasma processing techniques. In one embodiment, multi-zoned gas injection systems may be utilized to direct certain gases in certain regions of the plasma processing system. Further, techniques may be provided to substantially maintain these gases in the desired regions, as opposed to the gases spreading across the entirety of the substrate. Thus, in one embodiment, reactive gases may be provided in one region while a flow of inert gas is provided in other regions in which it is desired to restrict the effects of the reactive gases. The inert gas flow helps maintain regions free of the reactive gases. In other embodiments, process variables such as pressure, power, temperature, electrode voltage, magnetic field, etc. may be utilized to help maintain the reactive gases in the desired localized regions. In one embodiment, the localized control of the plasma process may be provided as a separate plasma processing step. In another embodiment, the localized region of the substrate may be the edge of the substrate.

In one embodiment, localized plasma processing is performed in an additional process step. The additional process step, in one embodiment, may be either a polymer removal or polymer deposition step performed after a main etch or in-between etch steps. In one embodiment, the localized plasma processing is performed at the edge of the substrate. In one embodiment, the localized plasma processing is particularly useful for obtaining CD uniformity across a substrate.

In one embodiment, a method for plasma processing a substrate is provided. The method may comprise loading the substrate into a plasma processing chamber, the plasma processing chamber comprising a multi-zoned gas injection system, and processing the substrate in a first plasma in the plasma processing chamber. The method may further comprise, following the processing in the first plasma, processing the substrate in a second plasma in the plasma processing chamber, wherein the second plasma is formed by locally flowing a reactive gas into one or more first zones of the multi-zoned gas injection system and not flowing the reactive gas into one or more second zones of the multi-zoned gas injection system, the first and second zones being different. The method for plasma processing the substrate may be an etch method and/or a deposition method.

In another embodiment, a method for plasma processing a substrate is provided. The method may comprise loading the substrate into a plasma processing chamber, the plasma processing chamber comprising a multi-zoned gas injection system, and processing the substrate in a first plasma in the plasma processing chamber. The method may further comprise, following the processing in the first plasma, processing the substrate in a second plasma in the plasma processing chamber, wherein the second plasma is formed by flowing an inert gas into a first set of one or more zones of the multi-zoned gas injection system, and flowing a reactive gas into a second set of one or more zones of the multi-zoned gas injection system proximate a first region of the substrate. The method for plasma processing the substrate may be an etch method and/or a deposition method.

In another embodiment, a method for processing a substrate is provided. The method may comprise loading the substrate into a plasma processing chamber and processing the substrate in a first plasma in the plasma processing chamber. The method may further comprise, following the processing in the first plasma, locally providing a reactive gas adjacent a local region of the substrate while processing the substrate in a second plasma, the local region of the substrate not comprising the whole substrate. The method for processing the substrate may be an etch method and/or a deposition method.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

It has been found that improved plasma processing results may be obtained through the use of localized plasma control. In such techniques, the plasma conditions may be purposefully changed for various localized regions of a substrate. Thus, for example, a reactive gas may be maintained in a localized region of a substrate while other regions of the substrate are not exposed to such reactive gas. In this manner, specific plasma conditions may be generated at specific regions of the substrate. The creation of a locally controlled plasma may occur through a variety of plasma processing techniques. In one embodiment, multi-zoned gas injection systems may be utilized to direct certain gases in certain regions of the plasma processing system. Further, techniques may be provided to substantially maintain these gases in the desired regions, as opposed to the gases spreading across the entirety of the substrate. Thus, in one embodiment, reactive gases may be provided in one region while a flow of inert gas is provided in other regions in which it is desired to restrict the effects of the reactive gases. The inert gas flow helps maintain regions free of the reactive gases. In other embodiments, process variables such as pressure, power, temperature, electrode voltage, magnetic field, etc. may be utilized to help maintain the reactive gases in the desired localized regions. In one embodiment, the localized control of the plasma process may be provided as a separate plasma processing step.

In one embodiment, the techniques described herein may be utilized for localized polymer control of a plasma processing. In one embodiment, the localized control may be utilized to remove polymer deposited in regions of a substrate. In another embodiment, the localized control may be utilized to enhance polymer deposition in a region of a substrate. In one embodiment, the localized region may be an edge region of a substrate.

In another embodiment, the localized control of the plasma process may be utilized to enhance critical dimension (CD) control across a substrate by providing localized control of a plasma etch process. In such a technique, improved CD performance may be obtained by providing localized control of either the deposition of polymer or the removal of polymer in a desired localized region of the substrate. In one embodiment, the localized control of polymer is performed in edge regions of the substrate. In another embodiment, the control of polymer is performed by providing a localized polymer control plasma processing step separate from other etch steps of the plasma etch process.

Figure 1A:
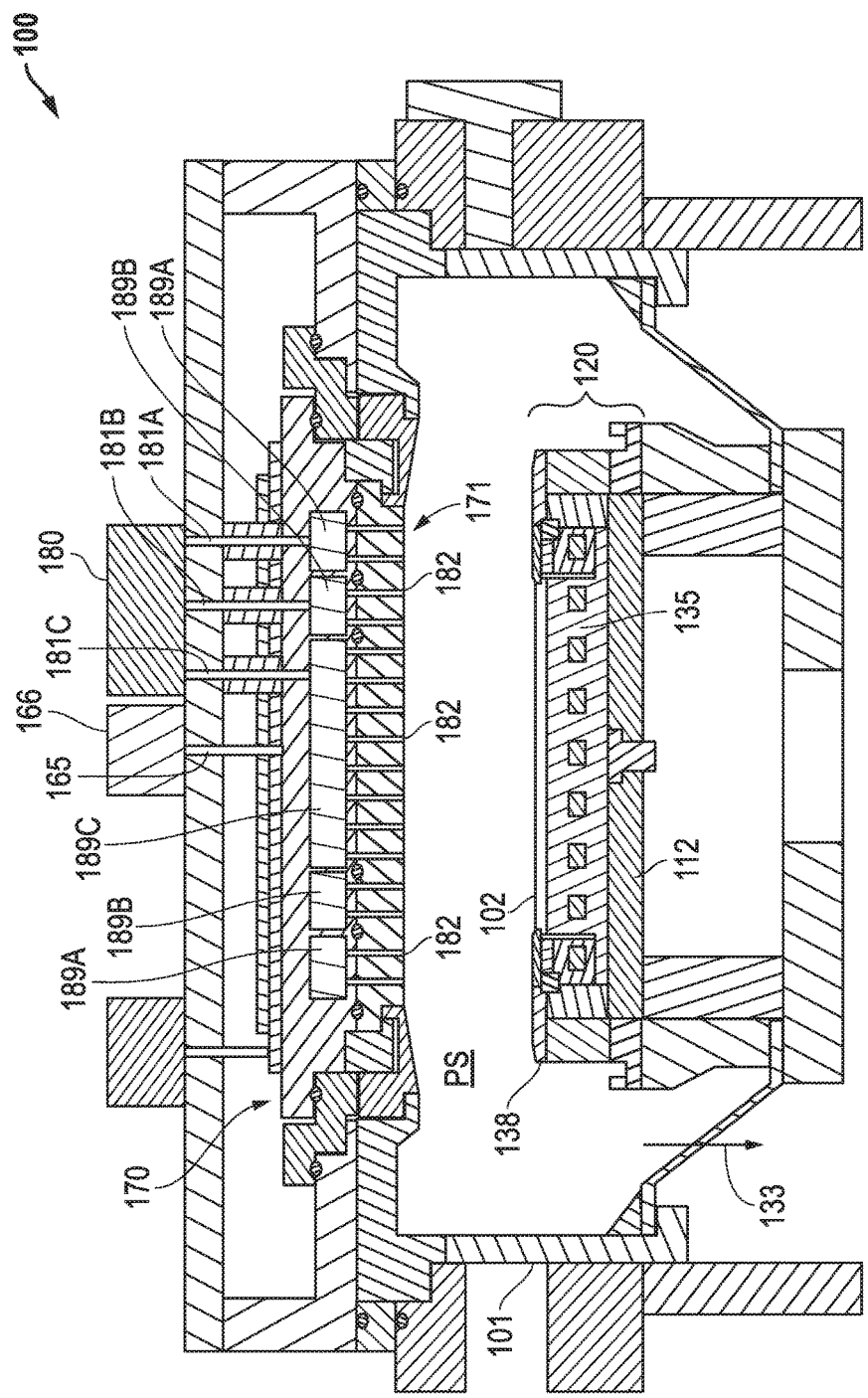
FIG. 1A illustrates an exemplary plasma processing system for implementing the plasma processing techniques described herein.

The techniques described herein may be utilized with a wide range of plasma processing systems. For example, the techniques may be utilized with plasma etch process systems, plasma deposition process systems or any other plasma process system. FIG. 1 illustrates one exemplary plasma process system merely for illustrative purposes. It will be recognized that other plasma process systems may equally implement the concepts described herein. FIG. 1 is a schematic cross-sectional view of a capacitively coupled plasma processing apparatus 100. Any alternative plasma process apparatus may also be utilized, including for example, but not limited to, inductively coupled plasma processing apparatus, microwave plasma processing apparatus, and the like. A capacitively coupled plasma processing apparatus may be particularly well suited as the electrode spacing of such apparatus allow beneficial control of gases to a localized region of the plasma space, thus providing localized plasma processing on the substrate.

The plasma processing apparatus 100 can be used for multiple operations including ashing, etching, deposition, cleaning, plasma polymerization, plasma-enhanced chemical vapor deposition (PECVD), atomic layer deposition (ALD) and so forth. The structure of a plasma processing apparatus 100 is well known, and the particular structure provided herein is merely exemplary. Plasma processing can be executed within processing chamber 101, which can be a vacuum chamber made of a metal such as aluminum or stainless steel. The processing chamber 101 defines a processing vessel providing a process space PS for plasma generation. An inner wall of the processing vessel can be coated with alumina, yttria, or other protectant. The processing vessel can be cylindrical in shape or have other geometric configurations.

At a lower, central area within the processing chamber 101, a susceptor 112 (which can be disc-shaped) can serve as a mounting table on which, for example, a substrate 102 to be processed (such as a semiconductor wafer) can be mounted. Substrate 102 can be moved into the processing chamber 101 through a loading/unloading port and gate valve. Susceptor 112 forms part of a lower electrode assembly 120 as an example of a second electrode acting as a mounting table for mounting substrate 102 thereon. The susceptor 112 can be formed of, e.g., an aluminum alloy. Susceptor 112 is provided thereon with an electrostatic chuck (as part of the lower electrode assembly) for holding the substrate 102. The electrostatic chuck is provided with an electrode 135. Electrode 135 is electrically connected to direct current (DC) power source, not shown. The electrostatic chuck attracts the substrate 102 thereto via an electrostatic force generated when DC voltage from the DC power source is applied to the electrode 135. The susceptor 112 can be electrically connected with a high-frequency power source via a matching unit. This high-frequency power source (a second power source) can output a high-frequency voltage in a range from, for example, 2 MHz to 20 MHz. Applying high frequency bias power causes ions, in plasma generated in the processing chamber 101, to be attracted to substrate 102. A focus ring assembly 138 is provided on an upper surface of the susceptor 112 to surround the electrostatic chuck.

An exhaust path 133 can be formed through one or more exhaust ports (not shown) which connect to a gas exhaust unit. The gas exhaust unit can include a vacuum pump such as a turbo molecular pump configured to decompress the plasma processing space within the processing chamber 101 to a desired vacuum condition. The gas exhaust unit evacuates the inside of the processing chamber 101 to thereby depressurize an inner pressure thereof up to a desired degree of vacuum.

An upper electrode assembly 170 is an example of a first electrode and is positioned vertically above the lower electrode assembly 120 to face the lower electrode assembly 120 in parallel. The plasma generation space or process space PS is defined between the lower electrode assembly 120 and the upper electrode assembly 170. The upper electrode assembly 170 includes an inner upper electrode 171, having a disk shape, and an outer upper electrode which may be annular and surrounding a periphery of the inner upper electrode 171. The inner upper electrode 171 also functions as a processing gas inlet for injecting a specific amount of processing gas into the process space PS above substrate 102 mounted on the lower electrode assembly 120. The upper electrode assembly 170 thereby forms a shower head. More specifically, the inner upper electrode 171 includes gas injection openings 182.

The upper electrode assembly 170 may include one or more buffer chamber(s) 189A, 189B, and 189C. The buffer chambers are used for diffusing process gas and can define a disk-shaped space. Processing gas from a process gas supply system 180 supplies gas to the upper electrode assembly 170. The process gas supply system 180 can be configured to supply a processing gas for performing specific processes, such as film-forming, etching, and the like, on the substrate 102. The process gas supply system 180 is connected to gas supply lines 181A, 181B, and 181C forming a processing gas supply path. The gas supply lines are connected to the buffer chambers of the inner upper electrode 171. The processing gas can then move from the buffer chambers to the gas injection openings 182 at a lower surface thereof. A flow rate of processing gas introduced into the buffer chamber 189 can be adjusted by, e.g., by using a mass flow controller. Further, the processing gas introduced is discharged from the gas injection openings 182 of the electrode plate (showerhead electrode) to the process space PS. The inner upper electrode 171 functions in part to provide a showerhead electrode assembly.

As shown in FIG. 1, three buffer chambers 189A, 189B, and 189C are provided corresponding to edge buffer chamber 189A, middle buffer chamber 189B, and center buffer chamber 189C. Similarly gas supply lines 181A, 181B, and 181C may be configured as edge gas supply line 181A, middle gas supply line 181B and center gas supply line 181C. The buffer chambers are provided in a manner corresponding to different localized regions of the substrate in this case edge, middle and center. As will be discussed more below, these regions may correspond to specific process plasma process conditions for localized regions of the substrate 102. It will be recognized that the use of three localized regions is merely exemplary. Thus, the plasma processing apparatus may be configured to provided localize plasma process conditions on any number of regions of the substrate, as will be recognized after having the benefit of reviewing this disclosure. In operation, the process gas supply system 180 may be configured as a gas flow system that can provide independent gas flows to each buffer chamber. Thus, for example, the process gas supply system 180 may be configured to receive a number of process gases (for example in one embodiment, up to 18 gases). The process gas supply system 180 may be configured in a manner such that any combination of the available process gases may be provided to any combination of the buffer chambers. Alternatively, the process gas supply system 180 may be configured in different manners. In one example, all of the process gasses may be available to the center buffer chamber 189C and middle buffer chamber 189B, but only a subset of process gasses are available to the edge buffer chamber 189A. As mentioned, any of a variety of configurations may be utilized, and the techniques described herein are not limited to the manner in which the process gas supply system 180 is configured to split the gas flows to the various buffer chambers.

The upper electrode assembly 170 is electrically connected with a high-frequency power source (not shown) (first high-frequency power source) via a power feeder 165 and a matching unit 166. The high-frequency power source can output a high-frequency voltage having a frequency of 40 MHz (megahertz) or higher (e.g. 60 MHz), or can output a very high frequency (VHF) voltage having a frequency of 30-300 MHz. This power source can be referred to as the main power supply as compared to a bias power supply.

Components of the plasma processing apparatus can be connected to, and controlled by, a control unit, which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. In operation, the plasma processing apparatus uses the upper and lower electrodes to generate a plasma in the processing space PS. This generated plasma can then be used for processing a target substrate (such as substrate 102 or any material to be processed) in various types of treatments such as plasma etching, chemical vapor deposition, treatment of semiconductor material, glass material and large panels such as thin-film solar cells, other photovoltaic cells, and organic/inorganic plates for flat panel displays, etc.

High-frequency electric power, in a range from about 3 MHz to 150 MHz, is applied from the high-frequency power source to the upper electrode assembly 170. Application of power results in a high-frequency electric field being generated between the upper electrode assembly 170 and the lower electrode assembly 120. Processing gas delivered to process space PS can then be dissociated and converted into a plasma. A low frequency electric power in a range from about 0.2 MHz to 20 MHz can be applied from the high-frequency power source to the susceptor 112 forming the lower electrode. In other words, a dual frequency system can be used. As a result, ions in the plasma are attracted toward the susceptor 112, and thus anisotropy characteristics are increased by ion assistance. Note that for convenience, FIG. 1 is described with the high-frequency power source supplying power to the upper electrode assembly 170. In alternative embodiments, the high-frequency power source can be supplied to the lower electrode assembly 120. Thus, both main power (energizing power) and the bias power (ion acceleration power) can be supplied to the lower electrode.

In one embodiment, a plasma process having localized process control is provided within a plasma system. The plasma system may be, for example, a plasma processing apparatus 100 such as shown in FIG. 1, however, it will be recognized the techniques described herein may be incorporated into many other plasma processing apparatuses, as would be recognized by those skilled in the art after having the benefit of consideration of this disclosure. The plasma process may include an edge CD control process that may be incorporated after any step in a process recipe to correct the patterned substrate profile in that region of the substrate, by adding or removing polymer for CD fine tuning, in a plasma chamber. In one embodiment, a plasma etch CD control step has been developed for removing edge polymer by applying a short O2 ash (flash) step predominantly toward the edge of the substrate using a gas distribution control system for adding O2 to the edge region of the substrate. In other techniques, the edge gas may be an oxygen-containing gas, a carbon-containing gas, a hydrogen-containing gas, a fluorine-containing gas, or a mixture of two or more thereof. In another embodiment, CD control may be obtained by introducing polymer forming gases to the edge region. Exemplary polymer forming gases, include but are not limited to, $C_xF_y$ or $CH_xF_y$ containing gases. For example, the reactive gas may comprise CF4, C3F8, C4F8, C4F6, CHF3, CH2F2, or a mixture of two or more thereof.

In one embodiment, the process may be utilized in a semiconductor substrate process flow for achieving a back end of line (BEOL) via etch. The techniques may utilize a plasma system that has a multi-zoned gas injection system which allows local tuning of the gas mixture adjacent different regions of the substrate, including adjacent the edge region. In the case of flashing the edge region (to remove polymer), a center flow main gas, such as an inert gas, facilitates the confinement of the O2 edge gas toward the substrate edge for precisely altering the CD in that region only. Thus, for example, in a system such as the plasma processing apparatus 100 of FIG. 1, the process gas supply system 180, gas supply lines 181A, 181B, and 181C, and corresponding buffer chambers 189A, 189B, 189C may be controlled during an edge control process step. Specifically, in one exemplary embodiment, the edge control process step may provide O2 edge gas to the plasma process space through gas supply lines 181A and buffer chamber 189A, while an inert gas is provided to the plasma process space through gas supply lines 181B and 181C and buffer chambers 189B and 189C. Similar techniques may be utilized to confine polymer deposition gases to the edge region, if the edge control step is a polymer deposition step. As described, in one embodiment, the disclosed concepts leverage the existence of multiple gas line entry ports for a plasma process chamber that enable the confinement of a specific polymerizing or oxidizing polymer removal trim gas toward the edge of the substrate using multiple zones. Alternate embodiments may utilize a circular gas ring oriented around the perimeter of the substrate with and without electrostatic and magnetic confinement of charged ions and electrons toward the edge of the substrate, while utilizing controlled biasing of electrodes in the proximity of the substrate for edge CD tuning. However, it will be recognized that many other control techniques may be utilized to provide for localized plasma processing conditions.

In one embodiment, the techniques described herein may be utilized to address the center-to-edge polymerization of a dry etch profile which evidences a non-uniformity at the edge of a substrate due to plasma-induced heating effects in the proximity of that area. In such cases, the polymer thickness is significantly higher towards the edge of the substrate, causing a more narrow CD for the etch profile, referred to as an edge roll-off. In one proposed embodiment to control the polymerization, an additional polymerization trim step or an additional polymerizing step is added after the main etch or in-between etch steps to provide localized plasma control at the edge of the substrate. As a result, this enables easier polymer control at the edge of the substrate compared to conventional approaches, as in the approached disclosed here primarily only trim or polymerizing gas are used as feed gas in the localized region, unlike in the conventional approach where these gases are mixed and flowed across the entire surface of the substrate during a main etch. Thus, a unique edge CD control step may be added to the etch process. This step is particularly beneficial in addressing hardware driven non-uniformity effects that may occur across a substrate.

Figure 1B:
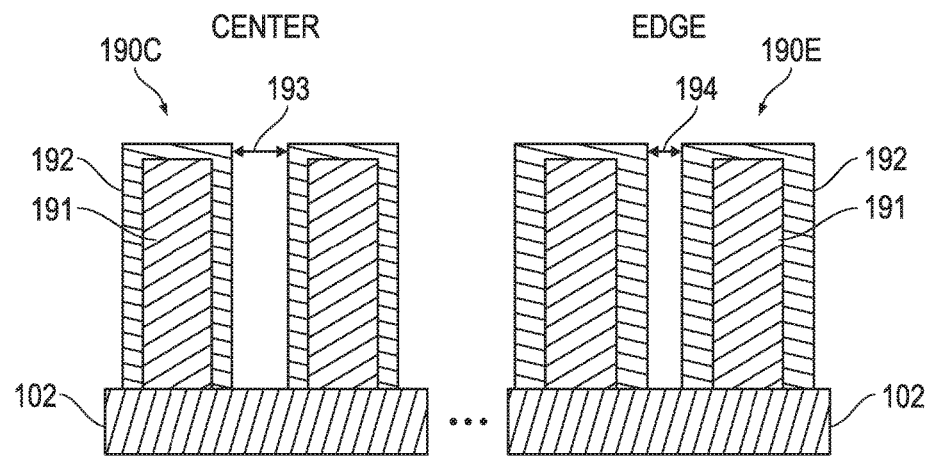
FIGS. 1B and 1C illustrate exemplary structures formed on substrates contrasting the effects of not utilizing (FIG. 1B) and utilizing (FIG. 1C) the localized plasma processing techniques described herein.
Figure 1C:
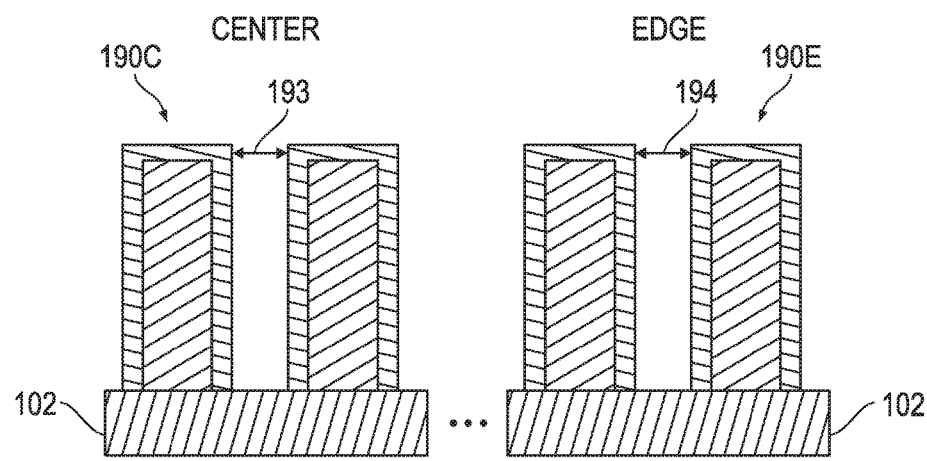

Thus, a process is disclosed which allows for precision corrective CD modification locally where needed across a substrate. The edge to center CD control impact may be illustrated as shown in FIGS. 1B and 1C. FIG. 1B provides an illustrative example of processing a semiconductor feature without the use of the techniques described herein, while FIG. 1C is an example of utilizing the techniques described herein. As shown in FIG. 1B, a substrate 102 may have features 191 formed in both a center region 190C and an edge region 190E of the substrate 102. A polymer layer 192 may form on the features 191 in both the center region 190C and an edge region 190E. However, the polymer layer 192 may be thicker in the edge region 190E than the center region 190C. Thus, a feature spacing gap 193 in center region 190C may be wider than a feature spacing gap 194 in edge region 190E, resulting in a CD non-uniformity across the substrate. FIG. 1C illustrates the effects of localized plasma processing according to the techniques described herein. As shown in FIG. 1C, the polymer layer 192 has been thinned in the edge region 190E due to a localized edge plasma thinning process step. Thus, the resulting feature spacing gap 193 in center region 190C may be substantially similar to a feature spacing gap 194 in edge region 190E. FIG. 1C merely illustrates one effect of providing the localized plasma process techniques described herein to provide improved plasma processing of substrates. It will be recognized that the techniques disclosed herein may be utilized for improving other plasma processing results, as the techniques are not limited to the example of FIG. 1C.

The techniques described herein may be implemented in a wide variety of plasma processing flows. FIGS. 2-6 describe exemplary process flows. It will be recognized that other process flows may be utilized while still gaining the benefit of the localized plasma processing control described herein.

Figure 2:
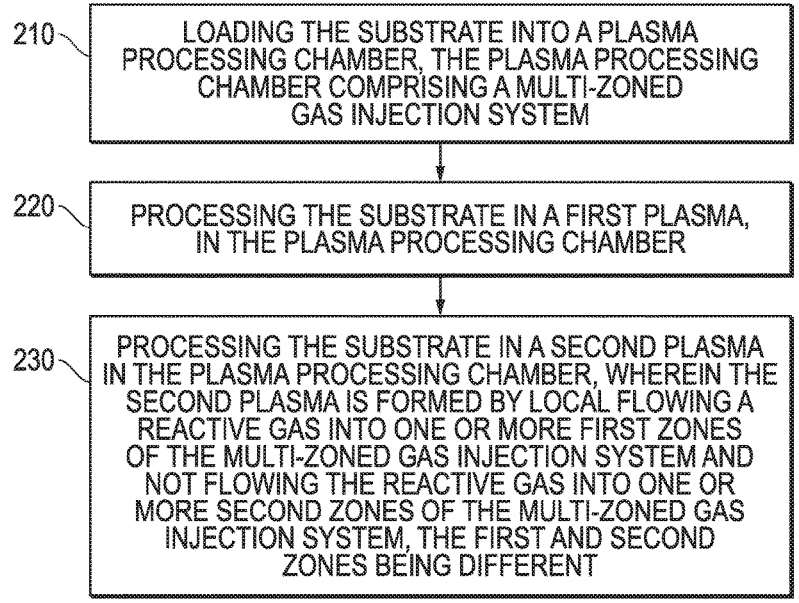
FIGS. 2-6 illustrate various exemplary process flows for methods utilizing the localized plasma processing techniques described herein.

As shown in FIG. 2, the plasma process flow may commence at step 210 by loading the substrate into a plasma processing chamber, the plasma processing chamber comprising a multi-zoned gas injection system. Then at step 220, the process continues with processing the substrate in a first plasma in the plasma processing chamber. Then at step 230, the process continues with processing the substrate in a second plasma in the plasma processing chamber, wherein the second plasma is formed by locally flowing a reactive gas into one or more first zones of the multi-zoned gas injection system and not flowing the reactive gas into one or more second zones of the multi-zoned gas injection system, the first and second zones being different.

Figure 3:
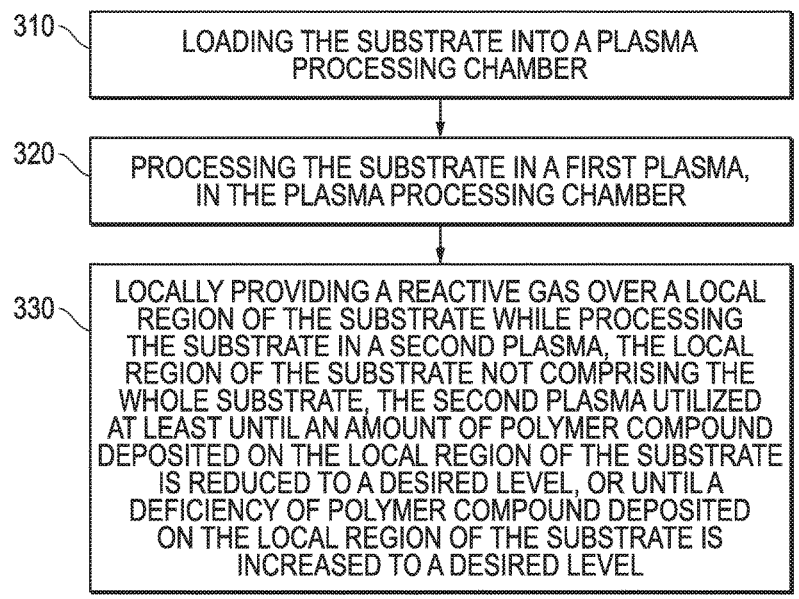

FIG. 3 illustrates an alternative process flow. As shown in FIG. 3, the plasma process flow may commence at step 310 by loading the substrate into a plasma processing chamber. Then at step 320 the process continues with processing the substrate in a first plasma in the plasma processing chamber. Then at step 330, the process continues with locally providing a reactive gas over a local region of the substrate while processing the substrate in a second plasma, the local region of the substrate not comprising the whole substrate. The second plasma may be utilized at least until an amount of polymer compound deposited on the local region of the substrate is reduced to a desired level, or until a deficiency of polymer compound deposited on the local region of the substrate is increased to a desired level.

Figure 4:
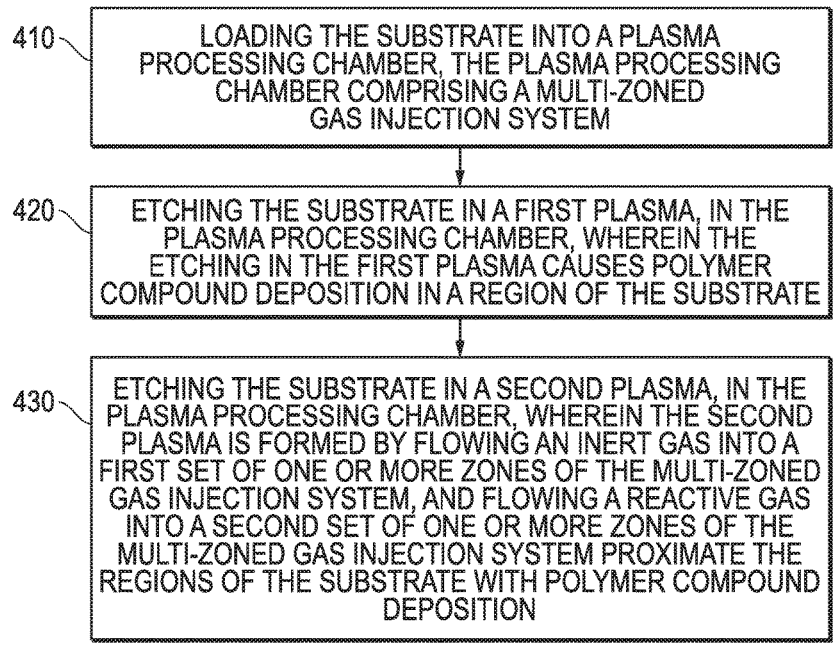

FIG. 4 illustrates an alternative process flow. As shown in FIG. 4, the plasma process flow may commence at step 410 by loading the substrate into a plasma processing chamber, the plasma processing chamber comprising a multi-zoned gas injection system. The process continues at step 420 with etching the substrate in a first plasma in the plasma processing chamber, wherein the etching in the first plasma causes polymer compound deposition in a region of the substrate. The process then proceeds to step 430 with etching the substrate in a second plasma in the plasma processing chamber, wherein the second plasma is formed by flowing an inert gas into a first set of one or more zones of the multi-zoned gas injection system. Step 430 further includes flowing a reactive gas into a second set of one or more zones of the multi-zoned gas injection system proximate the regions of the substrate with polymer compound deposition.

Figure 5:
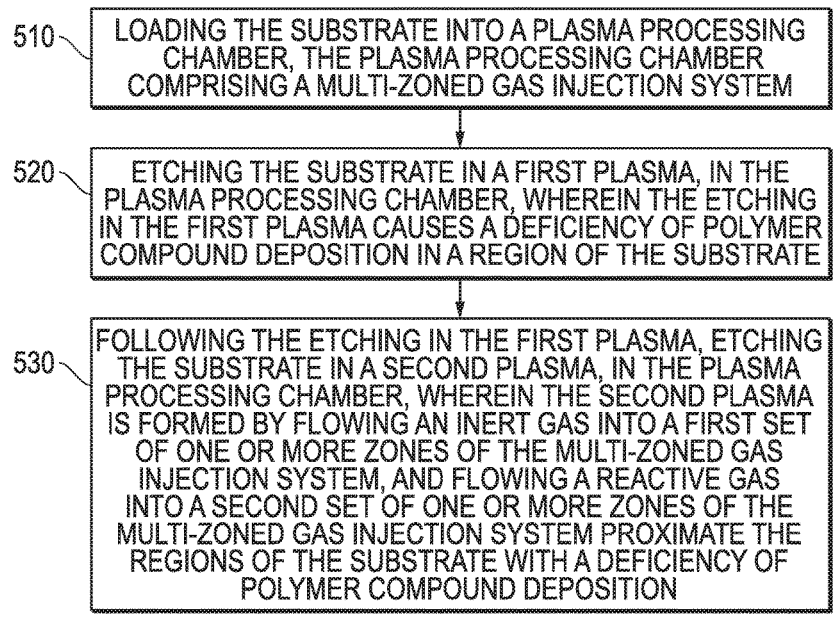

FIG. 5 illustrates an alternative process flow. As shown in FIG. 5, the plasma process flow may commence at step 510 by loading the substrate into a plasma processing chamber, the plasma processing chamber comprising a multi-zoned gas injection system. The process continues at step 520 with etching the substrate in a first plasma in the plasma processing chamber, wherein the etching in the first plasma causes a deficiency of polymer compound deposition in a region of the substrate. After the etching in the first plasma, the process then proceeds to step 530 with etching the substrate in a second plasma in the plasma processing chamber. In step 530, the second plasma is formed by flowing an inert gas into a first set of one or more zones of the multi-zoned gas injection system, and flowing a reactive gas into a second set of one or more zones of the multi-zoned gas injection system proximate the regions of the substrate with a deficiency of polymer compound deposition.

Figure 6:
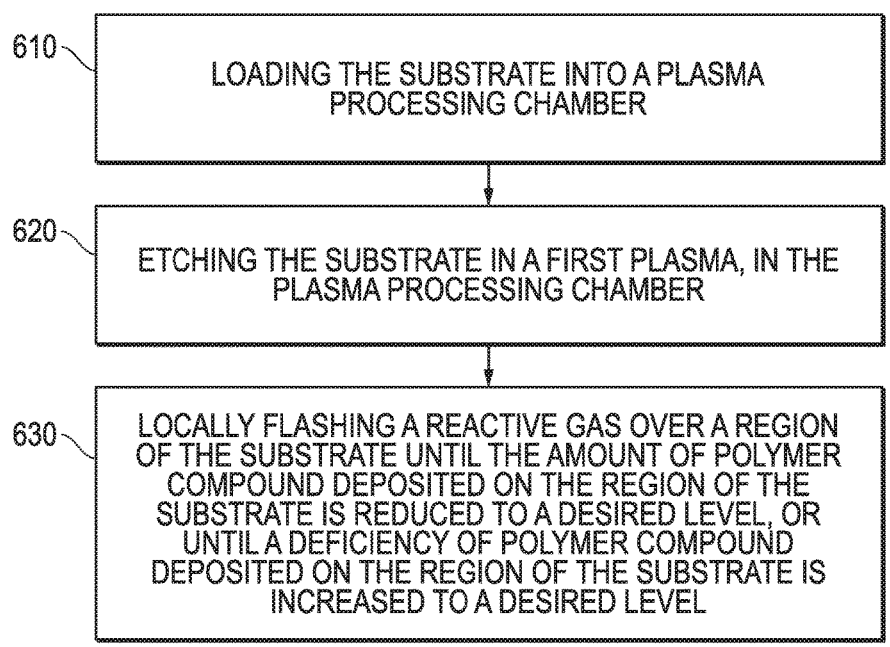

FIG. 6 illustrates an alternative process flow. As shown in FIG. 6, the plasma process flow may commence at step 610 with loading the substrate into a plasma processing chamber. The process then moves to step 620 for etching the substrate in a first plasma in the plasma processing chamber. The process continues at step 630 by locally flashing a reactive gas over a region of the substrate until the amount of polymer compound deposited on the region of the substrate is reduced to a desired level, or until a deficiency of polymer compound deposited on the region of the substrate is increased to a desired level.

A sample etch recipe to utilize with the techniques described herein and the plasma processing apparatus of FIG. 1 is shown in Table 1.

TABLE 1

| Process Parameter | | Step 1 BARC/ DARC | Step 2 Carbon Etch 1 | Step 3 Carbon Etch 2 | Step 4 OX Main Etch 1 | Step 5 O2 flash | Step 6 OX Main Etch 2 | Step 7 Ash |
|---|---|---|---|---|---|---|---|---|
| Main/Center Gas Flow Rate (sccm) | C4F8 | | | | 22 | | | |
| | C4F6 | | | | | | 14 | |
| | O2 | | 200 | | 13 | | 16 | 500 |
| | CHF3 | 48 | | | | | | |
| | CF4 | 150 | | | | | | |
| | N2 | | | 150 | | | | |
| | H2 | | | 450 | | | | |
| | Ar | | 100 | | 200 | 600 | 400 | |
| Center flow ratio | [%] | 50 | 50 | 50 | 60 | 20 | 60 | 60 |
| Edge Gas Flow Rate (sccm) | O2 | 3 | | | 5 | 10 | 8 | |
| | C4F8 | | | | | | | |

The etch recipe of Table 1 is an exemplary etch recipe for use in etching an exemplary structure in a multi-layer stack of films comprising an oxide layer, a carbon layer, and a bottom anti-reflective coating (BARC)/dielectric anti-reflective coating (DARC) layer. As shown, first the BARC/DARC etch step occurs, then two carbon etch steps occur, then a first main oxide etch occurs, then the localized plasma control step ("O2 Flash") occurs to control edge polymerization uniformity, then a second main oxide etch occurs, and finally a plasma ash process occurs. Such a stack of films may need to be etched, for example, as part of a via formation process.

As shown in the Table 1, the process conditions for each etch step are provided. According to the techniques described herein, an extra localized control plasma process step "O2 Flash" is provided. As noted by the recipe, generally the process steps (other than "O2 Flash") include reactive gas flows having a "Main/Center" gas flow rate. Such gases may be provided in the center and middle regions of the substrate process space, such as for example through gas supply lines 181B and 181C and buffer chambers 189B and 189C of FIG. 1. The "O2 Flash" process step provides localized plasma processing at the edge of the substrate by provision of reactive gas (O2) through gas supply lines 181A and buffer chamber 189A, while an inert gas (Ar) is provided to the plasma process space through gas supply lines 181B and 181C and buffer chambers 189B and 189C of FIG. 1. As shown in the recipe of Table 1, the localized plasma processing step occurs between two other etch steps of the recipe. It will be recognized that the techniques described herein may be utilized by the incorporation of one or more additional localized plasma process steps at any of a variety of points in the plasma process. Thus, the localized plasma process step may occur before other processing steps, in between two other plasma process steps or at the end of the plasma process. Further, it will be recognized that all of the gas flows provided are merely exemplary. Thus, other reactive gases (including for the localized plasma processing step) may be utilized. Further, through described with the use of Ar as the inert gas, other inert gases may be utilized to help confine the localized plasma process including, but not limited to N2, He, or any other inert gases. Further, though the localized plasma process step ("O2 Flash") is shown as a timed etch, optical emission spectroscopy (OES) may be utilized as an endpoint diagnostic (or merely as a diagnostic if a timed etch is used) for the "O2 Flash" trim step. More specifically, a higher O2 amount along with a lower CF or SiF-based OES intensity indicates a more effective CF and SiF residue removal by the end of the O2 Flash step. This enables a way to monitor polymer removal and the corresponding CD change. Note, OES techniques may also be used to monitor polymer deposition. It will be recognized that alternative monitoring techniques such as a laser induced fluorescence system, a laser interferometer system, a mass spectrometer system, residual gas analyzer system, or a Fourier Transform Infrared (FTIR) system could also be utilized.

The process parameters of Table 1 for the localized plasma control step are merely exemplary. Process parameters optimized for this step may include, but are not limited to: O2 edge gas flow, Ar main center gas flow, upper electrode voltage, power, etch time (with or without optical emission spectroscopy (OES) endpoint control), etc. to increase or trim the bottom etch profile CD at the edge of the substrate. Further, any number of other process parameters may be adjusted to obtain the desired feature critical dimension uniformity on the substrate. For example, the potential parameters of the etching in the second plasma that may be set, include but are not limited to the RF or microwave power supplied to the plasma processing chamber, RF or microwave power pulse frequency, RF or microwave pulse duty cycle, RF power supplied to a substrate holder in the plasma processing chamber, DC bias of the substrate holder, DC bias voltage supplied to at least one electrode arranged proximate the substrate holder, magnetic field, substrate temperature, substrate temperature distribution, inert gas flow rates to a first set of zones of the multi-zoned gas injection system, reactive gas flow rates to a second set of zones of the multi-zoned gas injection system, chamber pressure, and duration of the etching of the localized plasma. Any one or more of these parameters may thus be adjusted to provide a desired localized plasma process effect in the localized region, for example the desired edge region plasma.

Further, the process of Table 1 could be optimized additionally by altering the Ar center/O2 edge gas ratio and pressure to allow for maximal amount of Ar to be used for confining O2 toward the edge of substrate to achieve desired uniformity results. Analogously, any of the parameters discussed above could be adjusted for obtaining CF polymerizing conditions at the edge of a substrate as well, when edge polymer deposition is desired.

Though described with regards to a CD control of a via etch process, additional applications of the techniques disclosed herein will be recognized by those skilled in the art. For example, a flash step including O2, H2 and/or other reactants could be implemented as a contact resistance adjustment step as well for metal-rich polymer etching, since metal-rich polymer layers at the metal contact interfaces increase surface contact resistance resulting from metal etch processes. This can be particularly problematic as exposing organometallic polymer to moisture only increases contact resistance even more when the substrate is exposed to air after removing it from the etch chamber. Subsequent processing at elevated temperatures hardens this organometallic polymer making it even more difficult to remove. Further, these effects may have localized variations across a substrate, for example at the edge of a substrate. Thus, it may be desirable, in certain circumstances, to remove polymer buildup at the bottom of a via to minimize localized variations across a substrate. Thus, localized plasma processing may be utilized to minimize the effects of polymer buildup which may impact contact resistance. In such cases, an O2 flash step could also be utilized as a metal fill void reduction step at the edge of substrate by eliminating non-uniform, excess polymer residue.

In addition, as discussed above, an edge CD control step could alternatively include CF-based polymer edge gas for the opposite effect, i.e. to reduce the CD by sidewall passivation before or after any given etch step in a recipe, to achieve a more ideal overall CD uniformity. Furthermore, this localized plasma control step concept could be applied to numerous other types of plasma-based dry etch and plasma-based deposition processes for a wide variety of applications.

As mentioned above, the localized plasma control step of the plasma process may be provided at any stage of the plasma process. Furthermore, though the examples described herein are with reference example edge plasma processing, other regions of the substrate may be subjected to localized plasma processing. Thus, for example, the localized plasma processing step may be directed to the center of a substrate, middle of a substrate or any other region.

It will be noted that the local plasma processing techniques, such as the "O2 Flash" recipe step described above, direct no reactive gases in the zones outside of the localized zone; however, an insignificant or negligible amount of reactive gas could diffuse slightly outside the desired substrate region. It will be recognized that the local plasma processing techniques described herein are not limited to such an approach. Thus, for example with regards to the "O2 Flash" step, O2 could also be provided in the center and/or middle regions of the substrate through center and middle chamber gas zones. In such cases, the process conditions (flow rates, pressure, power, temperature, electrode voltage, magnetic field, etc.) may be adjusted to provide substantial localized control or enhanced localized control (for example at the edge of the substrate as compared to the center) even though some reactive plasma processing may occur in the other regions of the substrate. Thus, the benefits of the techniques described herein in are not strictly limited to the exclusion of reactive gases from the regions outside of the localized control region. In this manner, enhanced localized plasma processing may still occur in desired localized regions, even though some plasma processing may occur in other regions. Overall, these approaches noted herein associated with the various embodiments enable the flexibility of targeting specific substrate regions where non-uniformities exist in an etch process with a specific etch step dedicated to correcting local non-uniformity. This approach generates the highest degree of etch process control well beyond the common approach of modifying gas flow ratios, pressure and other process parameters in a main etch, which compromises what can be achieved with respect to etch uniformity across a full substrate.

Figure 7A:
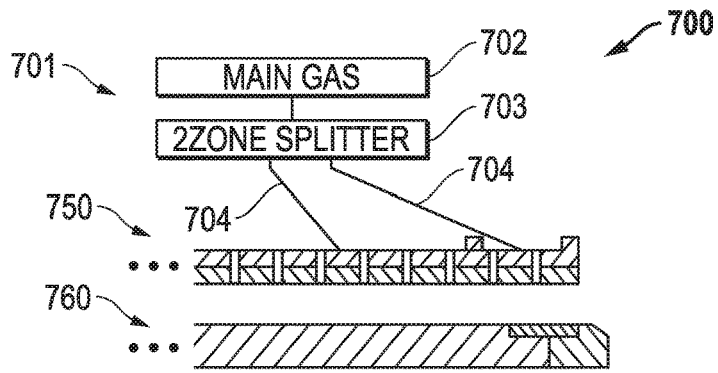
FIGS. 7A-7C illustrate alternative exemplary plasma processing systems for implementing the plasma processing techniques described herein.
Figure 7B:
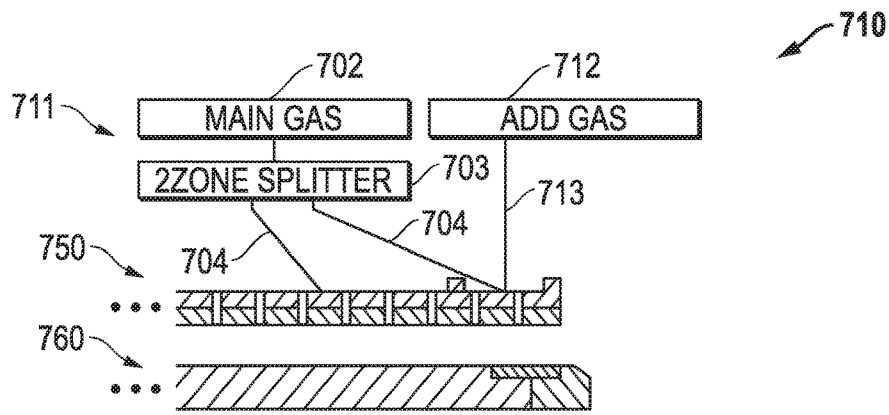
Figure 7C:
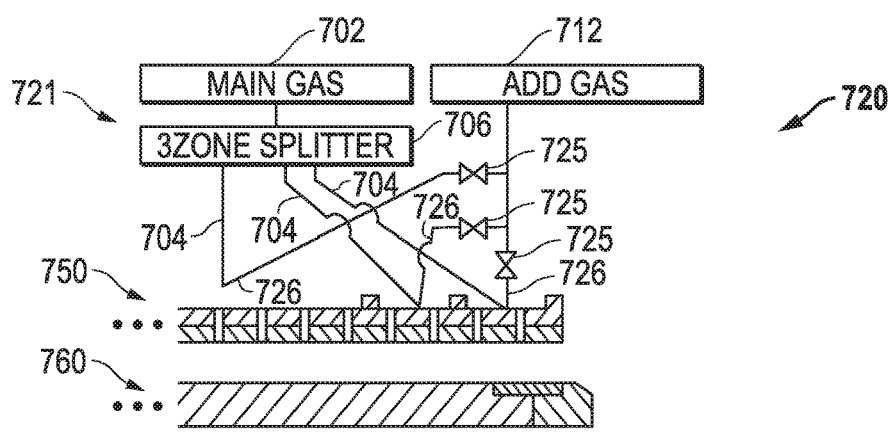

As discussed above, any of a wide variety of plasma processing systems may utilize the techniques discussed herein and the plasma processing apparatus of FIG. 1 is merely exemplary. For example, FIGS. 7A-7C illustrate alternative plasma processing systems, though again, the concepts disclosed herein are not limited to such embodiments. As shown in FIG. 7A, a plasma processing apparatus 700 has an upper electrode assembly 750 and a lower electrode assembly 760 (in the figure, just the region from the center to one edge of the electrode assemblies is illustrated). A multi-zoned gas injection system 701 is provided that has a main gas supply 702 that provides processing gas(es) through a two zone gas splitter 703 and gas lines 704. Process gas is supplied though gas lines 704 to the upper electrode assembly 750 through which gas passes to a process space between the electrode assemblies. Two zone gas splitter 703 may be selectively controlled to provide gas flow to desired gas lines 704 so as to selectively provide gas flow to differing localized regions of the process space. In operation, a localized plasma processing step may be utilized by providing the desired gas to the localized region of the process space that corresponds to the desired localized region of the substrate that is subjected to the plasma generated within the process space. Thus, the two zone splitter 703 may be utilized to selective control gas flow to the appropriate localized region.

As shown in FIG. 7B, a plasma processing apparatus 710 has an upper electrode assembly 750 and a lower electrode assembly 760 (in the figure, just the region from the center to one edge of the electrode assemblies is illustrated). A multi-zoned gas injection system 711 is provided that has (1) a main gas supply 702 that provides processing gas(es) through a two zone gas splitter 703 and gas lines 704 and (2) an additional gas supply 712 that provides additional process gas(es) through gas supply line 713. Process gas is supplied though gas lines 704 to the upper electrode assembly 750 through which gas passes to a process space between the electrode assemblies. Two zone gas splitter 703 may be selectively controlled to provide gas flow to desired gas lines 704 so as to selectively provide gas flow to differing localized regions of the process space. An additional gas supply 712 is also provided. Additional gas supply 712 provides additional process gas(es) through gas supply line 713 for providing additional gas at the edge of the process space. In this manner the main gas and additional gas provided to the process space may be controlled independently to provide more flexibility and control to each localized region of the process space. In operation, a localized plasma processing step may be utilized by providing the desired gas to the localized region of the process space that corresponds to the desired localized region of the substrate that is to be subjected to the plasma generated within the process space. Thus, the main gas supply 702, two zone splitter 703 and additional gas supply 712 may be selectively controlled to selectively control gas flow to the appropriate localized region.

As shown in FIG. 7C, a plasma processing apparatus 720 has an upper electrode assembly 750 and a lower electrode assembly 760 (in the figure, just the region from the center to one edge of the electrode assemblies is illustrated). A multi-zoned gas injection system 721 is provided that has (1) a main gas supply 702 that provides processing gas(es) through a three zone gas splitter 706 and gas lines 704 and (2) an additional gas supply 712 that provides additional process gas(es) through controllable valves 725 and gas supply lines 726. Process gas is supplied though gas lines 704 to the upper electrode assembly 750 through which gas passes to a process space between the electrode assemblies. Three zone gas splitter 706 may be selectively controlled to provide gas flow to desired gas lines 704 so as to selectively provide gas flow to differing localized regions of the process space. An additional gas supply 712 is also provided. Additional gas supply 712 provides additional process gas(es) through controllable valves 725 and gas supply lines 726 for providing additional gas at selective localized regions of the process space, for example center, middle and edge. In this manner the main gas and additional gas provided to the process space may be controlled independently to provide more flexibility and control to each localized region of the process space, such as center, middle and edge of the substrate. In operation, a localized plasma processing step may be utilized by providing the desired gas to the localized region of the process space that corresponds to the desired localized region of the substrate that is to be subjected to the plasma generated within the process space. Thus, the main gas supply 702, three zone splitter 706, additional gas supply 712, and controllable valves 725 may be selectively controlled to selectively control gas flow to the appropriate localized region.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A method for plasma processing a substrate, comprising:
    loading the substrate into a plasma processing chamber, the plasma processing chamber comprising a multi-zoned gas injection system;
    processing the substrate in a first plasma in the plasma processing chambers;
    following the processing in the first plasma, processing the substrate in a second plasma in the plasma processing chamber, wherein the second plasma is formed by locally flowing a reactive gas into one or more first zones of the multi-zoned gas injection system and not flowing the reactive gas into one or more second zones of the multi-zoned gas injection system, the first and second zones being different; and
    wherein after processing in the first plasma and prior to processing in the second plasma the substrate includes etched features with a polymer deposited within the etched features in both a first region of the substrate corresponding to a region processed by the one or more first zones and in a second region of the substrate processed by the one or more second zones, and wherein the second plasma increases or decreases the amount of polymer within the etched features in the first region of the substrate to become more uniform with the amount of polymer in the etched features in the second region of the substrate.

2. The method of claim 1, the processing the substrate in a first plasma comprising an etch process.

3. The method of claim 2, the second plasma locally removing polymer from the first region of the substrate.

4. The method of claim 2, the second plasma locally depositing polymer in the first region of the substrate.

5. The method of claim 2, wherein the first region of the substrate is an edge region of the substrate.

6. The method of claim 5, further comprising:
following the processing in the second plasma, processing the substrate in a third plasma in the plasma processing chamber.

7. The method of claim 1, the processing the substrate in a first plasma comprising a deposition process.

8. The method of claim 7, the deposition process being a chemical vapor deposition process or an atomic layer deposition process.

9. The method of claim 7, wherein the second region of the substrate is an edge region of the substrate.

10. The method of claim 9, further comprising:
following the processing in the second plasma, processing the substrate in a third plasma in the plasma processing chamber.

11. The method of claim 1, further including flowing an inert gas into the one or more second zones during processing of the substrate in the second plasma to inhibit processing of the second region of the substrate with the reactive gas of the second plasma.

12. A method for plasma processing a substrate, comprising:
loading the substrate into a plasma processing chamber, the plasma processing chamber comprising a multi-zoned gas injection system;
processing the substrate in a first plasma in the plasma processing chamber; and
following the processing in the first plasma, processing the substrate in a second plasma in the plasma processing chamber, wherein the second plasma is formed by flowing a reactive gas into a first set of one or more zones of the multi-zoned gas injection system, and flowing an inert gas without flowing the reactive gas into a second set of one or more zones of the multi-zoned gas injection system;
wherein after processing in the first plasma and prior to processing in the second plasma the substrate includes etched features with a polymer deposited within the etched features in both a first region of the substrate corresponding to a region processed by the first set of one or more zones and in a second region of the substrate processed by the second set of one or more zones, and wherein the second plasma increases or decreases the amount of polymer within the etched features in the first region of the substrate to become more uniform with the amount of polymer in the etched features in the second region of the substrate; and
wherein the inert gas flowing into the second set of one or more zones during processing with the second plasma inhibits processing of the second region of the substrate with the second plasma.

13. The method of claim 12, wherein the first plasma causes the polymer to be deposited in the first region of the substrate.

14. The method of claim 13, wherein the second plasma removes the polymer at a contact interface at a bottom of an etched via so as to provide improved contact resistance uniformity across the substrate.

15. The method of claim 12, wherein the first plasma causes the deficiency of polymer deposition in the first region of the substrate.

16. The method of claim 12, wherein the first set of one or more zones of the multi-zoned gas injection system is located proximate an edge of the substrate.

17. The method of claim 12, further comprising:
following the processing in the second plasma, etching the substrate in a third plasma in the plasma processing chamber.

18. The method of claim 12, further comprising:
setting at least one parameter of the processing in the second plasma to obtain a desired feature critical dimension uniformity on the substrate.

19. The method of claim 18, wherein the at least one parameter of the processing in the second plasma is selected from the group comprised of RF or microwave power supplied to the plasma processing chamber, RF or microwave power pulse frequency, RF or microwave pulse duty cycle, RF power supplied to a substrate holder in the plasma processing chamber, DC bias of the substrate holder, DC bias voltage supplied to at least one electrode arranged proximate the substrate holder, magnetic field, substrate temperature, substrate temperature distribution, inert gas flow rates to the second set of zones of the multi-zoned gas injection system, reactive gas flow rates to the first set of zones of the multi-zoned gas injection system, chamber pressure, or duration of the etching in the second plasma.

20. The method of claim 12, further comprising:
monitoring and/or the processing in the second plasma using an optical emission spectroscopy (OES) system, a laser induced fluorescence system, a laser interferometer system, a mass spectrometer system, residual gas analyzer, or a Fourier Transform Infrared (FTIR) system.

21. The method of claim 12, further comprising:
setting at least one parameter of the etching in the second plasma to reduce organometallic polymer formation at a metal-polymer interface on the substrate.

22. The method of claim 21, wherein the inert gas comprises argon, helium, neon, or nitrogen, or a mixture of two or more thereof.

23. The method of claim 12, wherein the reactive gas comprises an oxygen-containing gas, a hydrogen-containing gas, a carbon-containing gas, a fluorine-containing gas, or a mixture of two or more thereof.

24. The method of claim 12, wherein the reactive gas comprises $CF_4$, $C_4F_8$, $C_3F_8$, $C_4F_6$, $CHF_3$, $CH_2F_2$, or a mixture of two or more thereof.

25. The method of claim 12, the processing the substrate in a first plasma comprising a deposition process in which the polymer is deposited in the etched features.

26. The method of claim 25, wherein the deposition process is a chemical vapor deposition process or an atomic layer deposition process.

27. The method of claim 25, wherein the first set of one or more zones of the multi-zoned gas injection system correspond to an edge region of the substrate.

28. A method for processing a substrate, comprising:
loading the substrate into a plasma processing chamber;
processing the substrate in a first plasma in the plasma processing chamber; and
following the processing in the first plasma, locally providing a reactive gas adjacent a first region of the substrate while processing the substrate in a second plasma, the first region of the substrate not comprising a second region of the substrate such that the reactive gas is not supplied adjacent the second region of the substrate; and
wherein after processing in the first plasma and prior to processing in the second plasma the substrate includes etched features with a polymer deposited within the etched features in both the first region of the substrate and in the second region of the substrate, and wherein the second plasma increases or decreases the amount of polymer within the etched features in the first region of the substrate to become more uniform with the amount of polymer in the etched features in the second region of the substrate.

29. The method of claim 28, wherein the method comprises etching the substrate in the first plasma, wherein the second plasma is utilized at least until an amount of a polymer deposited on the first region of the substrate is reduced to a desired level, or until a deficiency of the polymer deposited on the first region of the substrate is increased to a desired level.

30. The method of claim 29, wherein the second plasma removes the polymer from etched features in the first region of the substrate.

31. The method of claim 30, wherein the first region of the substrate is an edge region of the substrate.

32. The method of claim 31, wherein an oxygen-containing gas is utilized as part of forming the second plasma.

33. The method of claim 29, wherein the second plasma deposits the polymer in etched features in the first region of the substrate.

34. The method of claim 33, wherein the first region of the substrate is an edge region of the substrate.

35. The method of claim 28, the processing the substrate in a first plasma comprising a deposition process.

36. The method of claim 35, the deposition process being a chemical vapor deposition process or an atomic layer deposition process.

37. The method of claim 35, wherein the first region of the substrate is an edge region of the substrate.

38. The method of claim 28, further comprising:
setting at least one parameter of the processing in the second plasma to obtain a desired uniformity across the substrate of the at least one characteristic of the deposition process.

39. The method of claim 38, wherein the at least one parameter of the processing in the second plasma is selected from the group comprised of RF or microwave power supplied to the plasma processing chamber, RF or microwave power pulse frequency, RF or microwave pulse duty cycle, RF power supplied to a substrate holder in the plasma processing chamber, DC bias of the substrate holder, DC bias voltage supplied to at least one electrode arranged proximate the substrate holder, magnetic field, substrate temperature, substrate temperature distribution, reactive gas flow rates to a first set of zones of a multi-zoned gas injection system adjacent the first region of the substrate, inert gas flow rates to a second set of zones of the multi-zoned gas injection system adjacent the second region of the substrate, chamber pressure, or duration of the etching in the second plasma.

40. The method of claim 28, wherein the processing the substrate in a first plasma comprises etching the substrate in the first plasma, wherein the second plasma is utilized to provide improved feature critical dimension uniformity on the substrate.

41. The method of claim 28, wherein the processing the substrate in a first plasma comprises etching the substrate in the first plasma, wherein the second plasma is used to remove the polymer at a contact interface at a bottom of an etched via so as to provide improved contact resistance uniformity across the substrate.

42. The method of claim 28, wherein the processing the substrate in a first plasma comprises etching the substrate in the first plasma, wherein the second plasma is used to reduce a non-uniformity of polymer in etched features across the substrate so as to provide improved void reduction characteristics for a subsequent fill process in which the etched features are filled.

43. The method of claim 28, further including providing an inert gas adjacent the second region of the substrate during processing with the second plasma to inhibit processing of the second region of the substrate by the reactive gas of the second plasma; and
wherein the reactive gas and the inert gas are both fed into the processing chamber from a top of the processing chamber.

* * * * *